June 18, 1968 J. L. LANGDON 3,389,023

METHODS OF MAKING A NARROW EMITTER TRANSISTOR
BY MASKING AND DIFFUSION

Filed Jan. 14, 1966

*INVENTOR.*
JACK L. LANGDON

*BY* [signature]

ATTORNEY

United States Patent Office 3,389,023
Patented June 18, 1968

3,389,023

METHODS OF MAKING A NARROW EMITTER TRANSISTOR BY MASKING AND DIFFUSION

Jack L. Langdon, Wappingers Falls, N.Y., assignor to International Business Machines Corporation, Armonk, N.Y., a corporation of New York Filed Jan. 14, 1966, Ser. No. 520,621
5 Claims. (Cl. 148—187)

ABSTRACT OF THE DISCLOSURE

A planar diffusion process is utilized to form a transistor having an emitter of a narrow effective width. The base region is formed by utilizing two separate steps of masking and subsequent diffusion. The first diffusion forms separate base portions that are diffused into the original wafer to some depth. The second diffusion step diffuses the impurity of the base region to a much shallower depth than the first diffusion step, and narrows the gap between the first formed base portions, and overlaps and joins the two prior formed base region portions. The emitter zone is then diffused into the area overlying part of the shallow portion of the base region.

Figure 1:
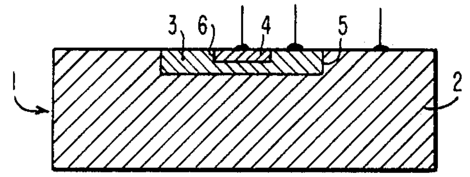
FIG. 1 (PRIOR ART)

This invention relates to semiconductor devices, and more particularly, to an improvement in transistor fabrication.

From the beginning of the revival of interest in semiconductors which followed the development of the transistor, much effort has been directed to the attainment of miniaturized or microelectronic circuitry incorporating solid state devices in complex arrangements. By various techniques semiconductor devices have been scaled down to miniscule sizes on the order of several mils, that is, thousandths of an inch in dimensions.

One of the most frequently used techniques for fabricating en masse great numbers of such tiny devices is the so-called mesa technique. In accordance with this technique, briefly considered, a junction is created over a broad area in a semiconductor wafer, and by a subsequent etching step the discrete collector junctions for a plurality of transistor devices are defined. This is accomplished by suitable masking of the surface of the wafer, such that selective etching takes place down to the broad area junction within the wafer, thereby creating mesas which rise above the base of substrate of the wafer. Thereafter, in the separated mesas the other required junction, that is, the emitter junction, for the individual devices is formed typically by alloying or diffusing in a desired impurity.

Another technique which is of great value in the fabrication of great numbers of minute devices and which involves a minimum of handling steps for each device is the so-called planar technique. In accordance with this technique the collector and emitter junctions are both defined by diffusion masking on the surface of a semiconductor wafer such that both junctions emerge at the surface of the wafer. These junctions are created by a sequence of masked diffusion steps. Thus, for example, in the process for producing a planar transistor, the upper surface of a semiconductor wafer is covered with an oxide coating. In the event that silicon is selected as the semiconductor material a silicon oxide coating is usually formed by oxidizing the surface of the wafer. Selected areas are opened in the oxide coating and a suitable impurity is diffused through the openings into the semiconductor wafer. Thereafter, in similar fashion, another mask is formed for the emitter diffusion, that is, a diffusion of an impurity of opposite conductivity type into the already formed base region, thereby to create the emitter region.

The planar technique as described above lends itself partcularly well to so-called integrated circuit configuration. Having formed the transistor devices within the wafer of semiconductor material by means of the controlled diffusion of selected impurities, the oxide mask, which is insulative, may be left on the surface of the wafer and appropriate conducting layers may be formed thereover so as to contact predetermined regions of the embedded devices and to interconnect as desired a plurality of such devices. The term "monolithic" has been applied to this integrated circuit approach.

According to another solid state circuit fabrication method the multiplicity of transistor devices as formed by the described planar technique are simply cut from the semiconductor wafer into so-called device "chips." These "chips" are later secured to a circuit board or module and are connected with other circuit components to form one or more complex circuit configurations by means of known printed circuit techniques.

Regardless of the particular integrated circuit approach that is adopted for incorporating transistor devices into complex arrangements, it is always highly desirable to achieve the highest speed capabilities for the devices themselves to insure that the circuits in which they are to function may be designed for the ultimate in switching speed. One of the important governing parameters for the achievement of high speed operation of these devices is the base resistance parameter. Base resistance consists of what may be termed extrinsic base resistance, and intrinsic base resistance. The former component is that resistance which exists in the portion of the base region extending from the active area to the base contact. The other component of base resistance, that is the intrinsic base resistance, is due to the active area, that is, the portion of the base region wherein carrier transport is mainly effected.

In order to achieve low base resistance it has been recognized that the emitter should be formed so as to have a very narrow width. In the description of the planar technique it was pointed out that the emitter region of the transistor is formed within the base region by a subsequent diffusion step using an impurity of opposite conductivity type to that used in the previous formation of the base region. However, a practical limitation is imposed on the minimum width of the emitter region, since, for communication to the emitter region of the device, an ohmic contact must be formed thereto. By adhering to conventional arrangements for making ohmic contact to the emitter, it becomes necessary that the emitter have a minimum width of 0.1 mil. Otherwise great difficulties are encountered in making such ohmic contact and possible shorting of the emitter junction would result.

It is, therefore, a primary object of the present invention to overcome and surmount this imposed limitation on the emitter width and to enable the formation of emitters which, effectively, are substantially reduced in size from those previously known.

Another object is to reduce substantially the intrinsic base resistance in a transistor device by facilitating the formation of a very narrow effective emitter region and to simultaneously reduce substantially the extrinsic resistance by arranging to have a highly doped region in the extrinsic base which is directly adjacent to the intrinsic base and thereby serves as a low resistance path to the base ohmic contacts.

The above objects are fulfilled by means of what may be termed a triple diffused transistor fabrication method whereby an extremely limited effective emitter width is obtained. In accordance with the technique of the present invention, broadly stated, the desired end is attained by first forming in the upper surface of the semiconductor wafer, by diffusion, spaced regions having a conductivity type opposite to that of the wafer. The spaced regions have an initial gap between them which is determined by the gap between the opened areas in a mask formed on the surface of the wafer. This gap may have a minimum width of 0.1 mil by present technology. Subsequently, a further diffusion step is carried out through another opening in a mask. This opening preferably overlies and extends beyond the spaced diffused regions. By this second step, performed with the same type of impurity as in the first step, the original spaced regions extend further inwardly of the wafer and, because of sidewise diffusion, the original gap between those regions narrows with the further penetration into the wafer. The effective emitter width is controlled and determined by these two steps. It is no longer controlled by the third step in the process, which is a conventional diffusion step that has been used heretofore in the formation of an emitter region. This third step merely controls, as before, the lateral extent of the diffusion of the emitter impurity, and hence it merely controls the width of the physical emitter to which ohmic contact is made.

In addition to the reduction in the intrinsic base resistance stemming from the substantial decrease in the emitter width, the extrinsic resistance is also substantially decreased due to the fact that the aforenoted spaced regions have been created by utilizing a very high concentration of diffusant at the surface of the wafer. Thus, very highly doped portions are situated adjacent the active portion of the base region and the ohmic contact thereto.

The foregoing and other objects, features and advantages of the invention will be apparent from the following more particular description of preferred embodiments of the invention, as illustrated in the accompanying drawings.

FIG. 1 is a sectional view of a planar transistor device of the prior art.

FIGS. 2*a* and 2*b*, 3*a* and 3*b*, 4*a* and 4*b* illustrate the several steps to be followed in accordance with the technique of the present invention.

Referring now to FIG. 1, there is shown a typical planar transistor as fabricated in accordance with the known procedures of the prior art. A device 1 is illustrated as consisting of a bulk portion 2 constituting the collector of the transistor and with diffused regions 3 and 4 constituting respectively, the base region and emitter region of the transistor. The polarity type is shown as NPN, but, of course, the opposite polarity of transistor could just as well have been shown. The collector junction 5 is defined by the regions 2 and 3, and the emitter junction 6, by the regions 3 and 4. The emitter region 4 has a minimum width, due to the aforenoted limitation thereon, of approximately 0.1 mil. Suitable ohmic contacts are made in a conventional way to the several regions of the transistor.

The technique of the present invention directed to overcoming the imposed limitation on the emitter width, will be described in three basic steps which are illustrated in FIGS. 2*a*, 2*b*, 3*a*, 3*b*, 4*a* and 4*b*. Each step is illustrated by a plan view of the semiconductor wafer and a sectional view thereof.

Figure 2A:
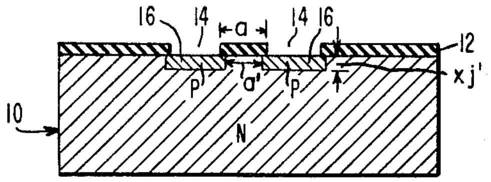
Figure 2B:
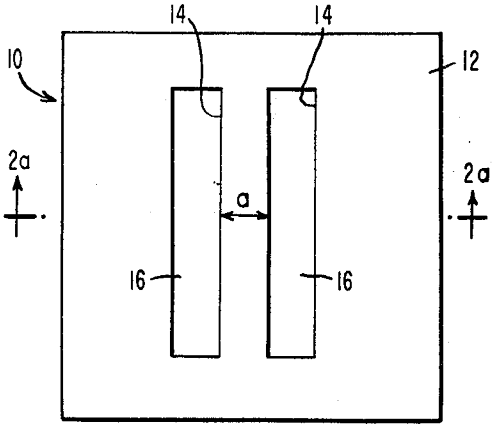

Referring now to FIGS. 2*a* and 2*b*, the wafer 10 is typically made of silicon which has been selected because of its desirable electrical properties and the ability to form conveniently an oxide layer thereon. The oxide layer 12 formed on the silicon wafer 10 serves as a mask, and as shown, has openings 14 therein, for selective diffusion of a typical impurity. In the case of an N conductivity-type wafer as illustrated, a P-type impurity such as boron is chosen. The openings 14, which have been formed in the oxide layer 12 to provide the requisite diffusion pattern, are produced by conventional photoresist techniques well-known to those skilled in the art.

The diffusion of the boron impurity through the openings 14 produces the P-type regions 16 at the upper surface of the wafer 10 and junctions 17 are defined thereby with the bulk of the wafer 10. The surface concentration of boron, would typically be $2\times10^{19}$ atoms/cm.$^3$ and the junction depth, designated $X_{j1}$ would be approximately 0.030 mil resulting in a sheet resistivity of about 300 ohms per square. This first boron diffusion step is carried out, for example, at a temperature of 970° C. for a period of approximately 120 minutes. Due to the fact that there is sidewise diffusion of the impurity at the surface, the gap between the spaced regions 16 is shown in FIG. 2*a* to have a dimension *a′* which is slightly less than the dimension shown for the gap between the openings or slots 14 in the oxide layer 12.

Figure 3A:
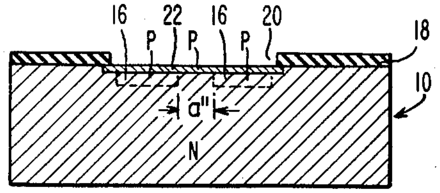
Figure 3B:
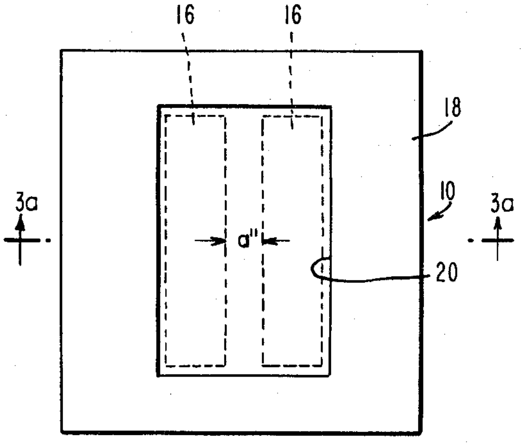

In the second basic step of the technique of the present invention, another diffusion operation, again using a P-type impurity such as boron,.is performed. In this step, as illustrated in FIGS. 3*a* and 3*b*, an additional area is opened in the oxide layer 18. The layer 18 is preferably one that is completely re-formed on this surface. The opening 20 corresponds with the opening that would be used conventionally in the formation of a base region by standard planar techniques. However, it will be noted that the opening 20 overlies and may extend beyond the periphery of the previously formed diffused regions 16. This second step is carried out for a shorter period than the first step, resulting in the penetration of the impurity atoms in a region 22, as shown in FIG. 3*a*. This second step is carried out, for example, at a temperature of 970° C. for a time period of approximately 90 minutes. The regions 16 are shown in FIG. 3*a* as having penetrated further into the wafer 10 and with a gap *a″* therebetween which is less than the original gap *a′* because of sidewise diffusion. Since the first two steps both involve the diffusion of a P-type impurity, the configuration for the base region of the transistor will be a composite of the regions 16 and the region 22.

Figure 4A:
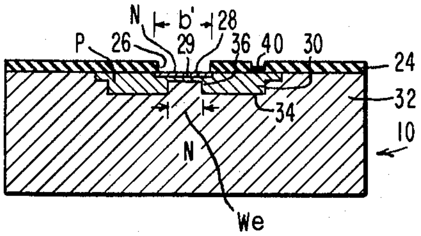
Figure 4B:
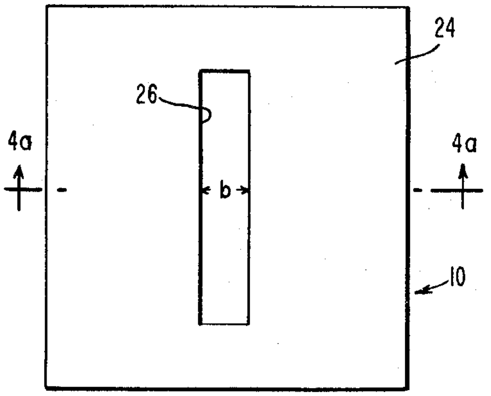

Referring now to FIGS. 4*a* and 4*b*, there is illustrated the third basic step of the technique of the present invention. In this step there is provided on the top surface of the wafer 10 an oxide layer 24 having an opening 26 therein. The opening 26 has a dimension designated *b* and corresponds substantially with the opening that would be used conventionally in the formation of the emitter region of a planar transistor. In the instant situation where a N-type wafer has been selected, the impurity for creation of the emitter is selected to be of N conductivity-type, for example, phosphorus. This third step is carried out, for example, at a temperature of 900° C. for a time period of approximately 15 minutes. The phosphorus is diffused through opening 26 and into the surface of the wafer 10, thereby forming the emitter region 28, which has a width *b′*. As noted heretofore, the limitation on the width of this physical emitter constituted by the region 28 is that it be 0.1 mil in order that proper ohmic contact may be made thereto.

The base region 30 has the irregular configuration depicted because of the first two steps of the technique. As the emitter region 28 is being formed in the manner described, there is, of course, a slight alteration of the original configuration for the base region as depicted previously in FIG. 3*a*. The collector 32 is made up of the bulk of the wafer 10 that remains unaffected by the sequential diffusion steps. The collector junction 34, defined by the base region 30 and the collector region 32, is of irregular geometry because of the aforedescribed operations and has a protuberant portion 36 which rises above the lower limit of the junction 34. The active portion of the base region 30 is thus precisely delimited where this protuberant portion 36 approaches the emitter junction 29.

Ohmic contacts are made in conventional fashion, as were illustrated in connection with the prior art arrangement of FIG. 1. However, only the ohmic contact 40 for the base region 30 has been shown in FIG. 4*a*.

It will be appreciated, therefore, that a very thin, active portion for the base region 30, extremely limited in lateral extent, has been produced and that consequently a very narrow effective emitter width has likewise been attained having the dimension $W_e$ as shown in FIG. 4*a*. Furthermore, since the original spacing between the oxide windows or openings 14, as described in connection with FIG. 2*a*, can be as low as 0.1 mil, the previously imposed limitation on the emitter width has been overcome. It will be appreciated that the only limitation on the width $W_e$ of the active or effective emitter is given by the relationship $a-2X_{j1}$ where $X_{j1}$ is the junction depth resulting from the first diffusion step. Since this may be selected to be of the order of 0.03 mil, it follows that $W_e$ may be as small as desired by judicious selection of diffusion parameters. For the particular diffusion parameters given previously, this width $W_e$ would be approximately 0.04 mil.

In addition to the resultant substantial decrease in the intrinsic base resistance due to the reduction in the effective emitter width down to the dimension $W_e$, there is also provided by the technique of the present invention a substantial decrease in the extrinsic base resistance. Referring now to FIG. 4*a*, it will be noted that immediately adjacent to the active portion of the base region 30, a low resistance path is provided for carriers to the ohmic contact 40. This result is achieved because of the previously described initial diffusion step involving the extremely high surface concentration for the diffusant.

In accordance with the preferred form of the technique of the present invention as described above, the second step thereof involved the formation in the oxide layer of an opening 20 which overlay and extended beyond the spaced regions 16 formed by the first diffusion step. However, it is not necessary that the opening so extend. Rather, an opening which corresponds with the opening having dimension *b* (as shown in FIG. 4*b* for the emitter formation) may be used in the second step of the method. Thus, the diffusion opening for the second step would simply overlie and extend between the spaced regions 16. Substantially the same irregular base configuration as in FIG. 4*a* would eventuate. This alternate procedure, of course, enables the last two diffusion steps to be performed with the same mask.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A process of fabricating a transistor device having an emitter region of very narrow effective width comprising the steps of forming an insulative mask adherent to the surface of a semiconductor wafer of predetermined conductivity type, and forming a base region by diffusing an impurity through an opening in said mask to define spaced regions of opposite conductivity type extending inwardly from said surface, said spaced regions having a slight gap between them thereafter, forming another insulative mask having an opening overlying said spaced regions, diffusing an impurity through said opening to define another region of the same conductivity type as said spaced regions, said another region being of shallower depth and bridging said spaced regions at the surface of the wafer, and forming a narrowed gap, substantially narrower than said slight gap, between the spaced regions inwardly of the wafer by the sidewise diffusion of said first-diffused impurity and thereafter, diffusing an impurity into said wafer to convert part of said base region to said predetermined conductivity type, thereby to produce an emitter region spanning the narrowed gap, the effective emitter width being defined by said narrowed gap.

2. A process as defined in claim 1, wherein the slight gap between the spaced regions is of the order of 0.1 mil and the narrowed gap is of the order of 0.04 mil.

3. A process as defined in claim 1, wherein the wafer is constituted of silicon and the masks are constituted of silicon oxide.

4. A process as defined in claim 3, wherein said first diffusion step is carried out at a temperature of 970° C. and for a time of approximately 120 minutes, said second diffusion step is carried out at a temperature of 970° C. for a time of approximately 90 minutes, and said third diffusion step is carried out at a temperature of 900° C. for a time of approximately 15 minutes.

5. A process as defined in claim 4, wherein the impurity for the first two diffusion steps is boron and the impurity for the third diffusion step is phosphorous.

References Cited

UNITED STATES PATENTS

| | | | |
|---|---|---|---|
| 3,281,915 | 11/1966 | Schramm | 148—187 XR |
| 3,319,311 | 5/1967 | Mutter | 148—187 XR |

HYLAND BIZOT, *Primary Examiner.*